(12) United States Patent
Goosey et al.

(10) Patent No.: US 6,861,097 B1
(45) Date of Patent: Mar. 1, 2005

(54) ELECTROLESS PLATING PROCESSES

(75) Inventors: Martin T. Goosey, Nr Daventry (GB); John E. Graves, Nuneaton (GB); Joachim Buch, Hohentengen (DE); Mark A. Poole, Rugby (GB); Deborah Hirst, Nuneaton (GB); Rebecca Holland, Stratford upon Avon (GB)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/172,533

(22) Filed: Oct. 14, 1998

(30) Foreign Application Priority Data

Oct. 17, 1997 (GB) .............................................. 9722028

(51) Int. Cl.[7] .............................. B05D 3/00; B31D 3/00
(52) U.S. Cl. ...................... 427/304; 427/306; 427/307; 427/443.1; 216/13; 216/56; 216/83
(58) Field of Search ............................. 216/13, 56, 83; 106/1.05, 1.11; 427/301, 304, 306, 307

(56) References Cited

U.S. PATENT DOCUMENTS

| | | | | |
|---|---|---|---|---|
| 4,035,500 A | * | 7/1977 | Dafter, Jr. .................... | 427/261 |
| 4,298,636 A | * | 11/1981 | Kunzig ........................ | 427/304 |
| 4,321,285 A | * | 3/1982 | Feldstein ...................... | 427/97 |
| 4,568,570 A | * | 2/1986 | Giesecke ..................... | 427/304 |
| 4,734,299 A | * | 3/1988 | Matuzaki et al. ........... | 427/304 |
| 5,242,713 A | * | 9/1993 | Viehbeck et al. ............ | 427/304 |

FOREIGN PATENT DOCUMENTS

| | | |
|---|---|---|
| DE | 0 297 738 A | 3/1968 |
| EP | 0 297 738 | 1/1989 |

OTHER PUBLICATIONS

D.M. Brewis et al., "A new general method of pretreating polymers", Paper L17, 4th Int'l Conference on Adhesion and Surface Analysis, Loughborough University, Leicestershire, pp. 1–8, (1996), no month.
D. M. Brewis et al., "New Pretreatments for Polymers", Loughborough University, Leicesterchire, no date.
D.M. Brewis et al., "A New general method of pretreating polymers", *Journal of Materials and Science Letters*; vol. 16; pp. 93–95 (1997), no month.

(List continued on next page.)

*Primary Examiner*—Brian K. Talbot
(74) *Attorney, Agent, or Firm*—Peter F. Corless; Darryl P. Frickey; Edwards & Angell, LLP

(57) ABSTRACT

The invention includes processes for combined polymer surface treatment and metal deposition. Processes of the invention include forming an aqueous solution containing a metal activator, such as an oxidized species of silver, cobalt, ruthenium, cerium, iron, manganese, nickel, rhodium, or vanadium. The activator can be suitably oxidized to a higher oxidation state electrochemically. Exposing a part to be plated (such as an organic resin, e.g. a printed circuit board substrate) to the solution enables reactive hydroxyl species (e.g. hydroxyl radicals) to be generated and to texture the polymer surface. Such texturing facilitates good plated metal adhesion. As part of this contacting process sufficient time is allowed for both surface texturing to take place and for the oxidized metal activator to adsorb onto said part. The part is then contacted with a reducing agent capable of reducing the metal activator to a lower ionic form, or a lower oxidation state. That reduction can result in the formation of metallic catalytic material over the surface of the part. The reduced metal activator can then function to catalyze the electroless deposition of metal such as copper from solution by contacting the part with the plating solution.

8 Claims, 3 Drawing Sheets

OTHER PUBLICATIONS

J. Bringmann et al., "Electrochemical mediators for total oxidation of chlorinated hydrocarbons: formation kinetics of Ag(II), Co(III), and Ce(IV)"; *Journal of Applied Electrochemistry*; vol. 25, pp. 846–851 (1995), no month.

Nauflett et al., "Development of an Electrochemical Waste Treatment Facility"; Naval Surface Warefare Center, Indian Head, MD, pp. 429–436, no date.

Noyes et al., "Argentic Salts in Acid Solution. III. Oxidation Potential of Argentous–Argentic Salts in Nitric Acid Solution"; *This Journal*, vol. 57, pp. 1238–1242 (1935), no month.

H. Po et al., "The Kinetics and Mechanism of the Oxidation of Water by Silver (II) in Concentrated Nitric Acid Solution"; *Inorganic Chemistry*, vol. 7, No. 2, pp. 244–249 (1968), no month.

R.R. Rao et al., "Anodic Oxidation of Lithium, Cadmium, Silver, and Tetra–n–Butylammonium Nitrates", *Analytical Chemistry*, vol. 42, No. 9, pp. 1076–1081 (1970), no month.

D.F. Steele et al., "The Electrochemical Destruction of Waste Reprocessing Solvent and Ion Exchange Resins", AEA Technology Dounreay, Thurso, Caithness, Scottland, pp. 167–174, No date.

D.F. Steele, "Electrochemistry and waste disposal", *Chemistry in Britain*, pp. 915–918 (1991), no month.

Zawodzinski et al., "Kinetic Studies of Electrochemical Generation of AG (II) Ion and Catalytic Oxidation of Selected Organics"; Proceedings of the symposium on Environmental and Photoelectrochemistry; Proceedings vol. 93–18, The Electrochemical Society, Inc. P nnington, New Jersey, pp. 170–176, no date.

Brewis et al., "A new general method of pretreating polymers"; *Journal of Materials Science Letters*; vol. 16, No. 2, pp. 93–95; Jan. 15, 1997.

* cited by examiner

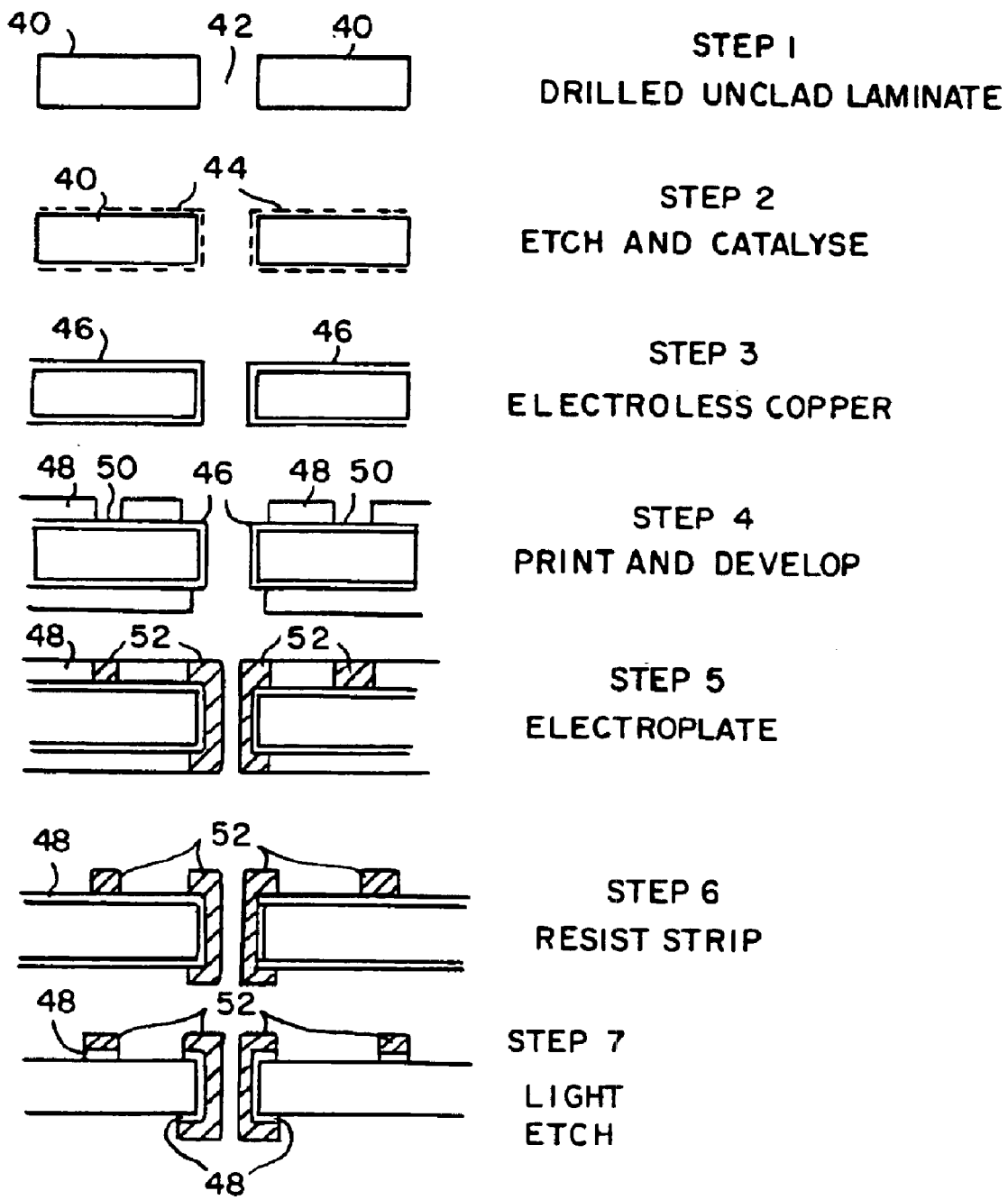

ELECTROLESS PLATING PROCESSES

BACKGROUND

1. Field of the Invention

This invention relates to metallization processes and more particularly to electroless plating, including e.g., copper plating of certain polymers such as ABS (acrylonitrile butadiene styrene) copolymers, epoxy resins, and other organic polymers, including non carbon-fluorine bond polymers.

2. Background

Conventional methods employed for metallizing polymers (e.g., ABS) utilize aggressive oxidizing agents such as chromic acid as part of the surface treatment prior to conditioning, catalyzation and electroless metal deposition. This results in a lengthy process which often utilizes undesirable chemicals that are both unpleasant to handle, difficult to treat after use and which are becoming increasingly environmentally unacceptable.

SUMMARY OF THE INVENTION

We have now found processes that include a surface treatment providing a substrate morphology leading, after further steps, to direct catalyzation of the substrate surface without the need for the traditional subsequent neutralization, conditioning and tin/palladium catalyzation steps. This is a major improvement since it removes several process steps, one of which is the use of chromic acid. The invention also obviates the need to use an expensive palladium based plating catalyst. The new processes are, in part, based upon the use of electrochemically or otherwise generated metal ions (e.g. $Ag^{2+}$ or $Co^{3+}$), referred to herein as metal activators. Suitable metal activators include silver, cobalt, ruthenium, cerium, iron, manganese, nickel, rhodium, and vanadium, with silver and cobalt being generally preferred.

In use, the metal activators are oxidized to a higher state (e.g. to Ag (II) or to Co (III)), preferably electrochemically. Without being bound by theory, it is believed the oxidized metal activator generates reactive hydroxyl species from water, such as hydroxyl radicals. These hydroxyl species are very reactive and attack polymer surfaces, particularly organic polymers, to give an ideal pitted morphology deemed desirable for subsequent metal adhesion and which is similar to that provided by chromic acid. In this process, following surface texturing the substrate is immersed in a reducing agent pre-dip solution and it can then be plated immediately by immersion in an electroless metal plating solution, e.g., copper bath without any further process steps. A further advantage of the invention is that the metal activator treatment solution (e.g. silver or cobalt solution) may be regenerated such as by electrochemical methods thus reducing problems encountered with waste treatment.

The present invention provides improved methods of plating polymers with metal e.g., copper, silver, nickel, gold, tin, cobalt etc. for subsequent use in other applications where molded plastic parts are used, e.g. to produce decorative parts such as in perfume bottle tops and in decorative automobile parts, and for electromagnetic interference (EMI) shielding applications. The invention is also useful to plate parts to produce molded electrical interconnect devices.

The present invention also is particularly useful in the manufacture of printed circuit boards. For example oxidizing agents such as potassium permanganate are used to remove resin smear and to provide a textured polymer surface prior to conditioning, catalyzation and electroless metal deposition. The use of transition oxidized metal species (e.g. $Ag^{2+}$ or $Co^{3+}$) in the production process removes several process steps and reduces chemical consumption.

As used herein, the term "metal activator" refers to a metal that is sufficiently water soluble to function in the processes of the invention and can be oxidized to a higher state to generate reactive hydroxyl species (e.g. hydroxide radicals) from water and promote electroless plating in accordance with the processes of the invention. Thus, suitable metal activators can be identified by simple testing, e.g. by testing a particular metal by the general procedure of Example 1 which follows to determine if electroless deposition is provided. In any event, as mentioned above, suitable metal activators include silver, cobalt, ruthenium, cerium, iron, manganese, nickel, rhodium, and vanadium, with silver and cobalt being generally preferred.

Other aspects of the invention are disclosed infra.

BRIEF DESCRIPTION OF THE DRAWINGS

FIG. 3 shows a preferred pattern plate process of the invention.

DETAILED DESCRIPTION OF THE INVENTION

Figure 1:
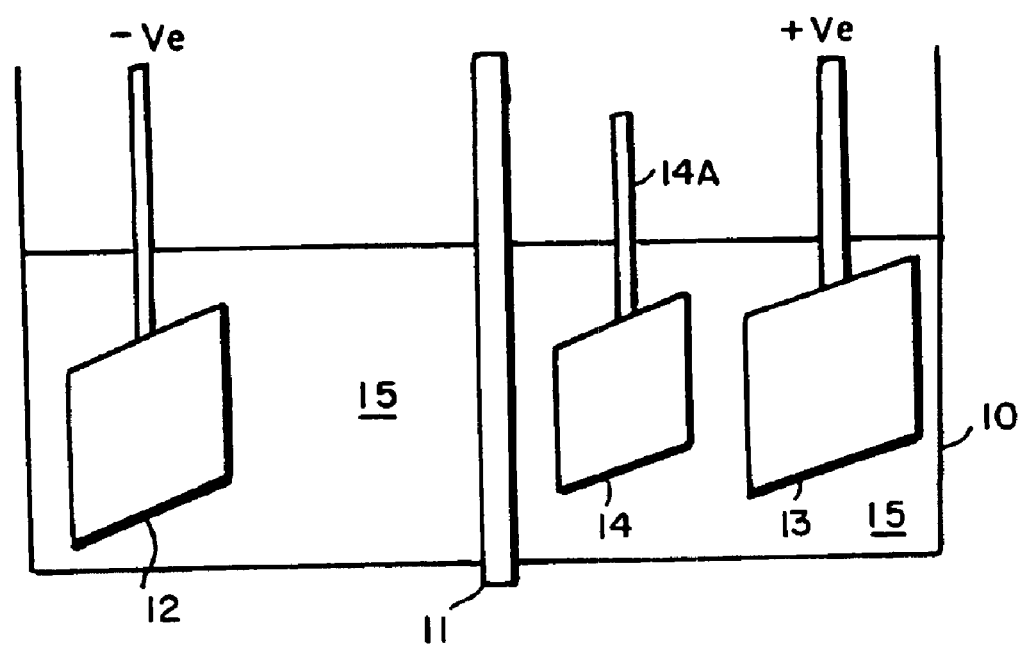
FIG. 1 illustrates diagrammatically a preferred process of the invention.

According to the first aspect of the invention, a process is provided for metallizing a part, particularly a polymer substrate such as ABS, which has been etched by a reactive hydroxyl species (e.g. hydroxyl radicals) generated from water as a result of the presence a metal activator (e.g. $Ag^{2+}$, $Co^{3+}$) in the water, and applying a reducing agent capable of reducing the oxidized metal activator species to a lower oxidation state (e.g. a zero oxidation state, or $Ag^{2+}$ to $Ag^+$, or $Co^{3+}$ to $Co^{2+}$). Any of a wide variety of reducing agents may be employed, e.g., a boron reagent such as a boron hydride or salts thereof e.g. sodium borohydride, and other boranes such as dimethylaminoborane; and other agents such as sodium dithionite, formaldehyde or a phosphite e.g., sodium hypophosphite, which is preferred. The oxidized metal activator species is typically generated electrochemically. After application of the reducing agent, electroless plating is employed, e.g., using electroless copper, nickel and the like to form a metal surface on the polymer substrate. In contrast to prior electroless processes, a Pd/tin, palladium, platinum or other electroless catalyst need not be employed to deposit effectively an electroless metal layer. In addition to ABS, other preferred polymers for metallization include e.g. polyamide, polycarbonate, ABS/polycarbonate blends, epoxy laminates particularly as used in printed circuit board manufacture, polyetherimides and liquid crystal polymers.

As another aspect of this invention, methods are provided for plating electroless metal such as electroless copper on a part, particularly a polymer substrate such as ABS, which comprises forming a metal layer on ABS having silver, cobalt or other metal activator thereon.

As yet a further aspect of this invention there is disclosed the use of electrochemically generated metal activator ions or oxidized species, such as silver$^{2+}$ ions, $Co^{3+}$, cerium (III) or (IV), iron (II) or (III), manganese (IV) or higher, nickel (II) (III) or (IV), ruthenium (V) (VI) (VII) (VIII), vanadium (IV) or (V), etc., in a combined surface treatment and metallization process where e.g. the silver ions generate hydroxyl radicals capable of texturing the polymer surface and which can also be reduced to silver metal on the surface so that the silver metal catalyses the subsequent electroless metal to be deposited thereon from a bath thereof, e.g. copper.

In order to achieve good quality metal deposits on polymers such as ABS, their surfaces are normally textured using aggressive solutions that provide a chemically and physically modified surface that is optimized for subsequent conditioning and electroless plating processes. Such materials that have been employed typically are strong oxidizing agents such as the alkali permanganates used with thermosets such as epoxides and chromic acid as used with thermoplastics such as Acrylonitrile Butadiene Styrene (ABS). The aim is to produce a reticulated textured surface that not only is amenable to conditioning with a subsequent surfactant but which also provides good keying and mechanical adhesion of the subsequently deposited electroless copper or other metal.

In the case of prior use of ABS and chromic acid, the acid preferentially attacks ABS butadiene groups leaving a surface optimized for subsequent plating. Unfortunately, chromic acid may be a carcinogen and also presents various waste treatment, disposal problems and environmental concerns. Accordingly, there is great interest therefore in the development of alternative methods of metallization that do not utilize chromic acid. The present invention provides such methods.

Oxidized metal activator species preferably are generated electrochemically using an undivided or divided cell containing the metal activator typically in salt form, e.g. as a sulphate salt in aqueous sulphuric acid solution, a nitrate salt in aqueous nitric acid solution, a fluoroborate salt in aqueous fluoroboric acid solution, a perchlorate salt in aqueous perchloric acid solution, a fluoride salt in aqueous hydrofluoric acid solution, a chloride salt in aqueous hydrochloric acid solution, a bromide salt in aqueous hydrobromic acid solution, a phosphate salt in aqueous phosphoric acid solution, a nitrate salt dissolved in either trifluoromethane sulphonic acid or trifluoroacetic acid aqueous solution, etc., or from a mixture of the above mentioned salts and acids. Specifically preferred metal salts/acid combinations include silver nitrate/nitric acid; silver percholate/perchloric acid; silver sulphate/sulphuric acid; silver phosphate/phosphoric acid; silver nitrate/trifluoromethane sulphonic acid; silver nitrate/trifluoroacetic acid; cobalt sulphate/sulphuric acid; and the like. Other suitable cobalt salts and acid combinations include halides, sulphates, nitrates and tetrafluoroborates dissolved in sulphuric, nitric, tetrafluoroboric or phosphoric acid, or any combination thereof. Ruthenium (IV) oxide and sodium metavanadate also may be employed dissolved in any mixture of the above mentioned acids. Other suitable metal activator salts include cerium (III) sulphate, iron (II) sulphate, manganese (II) sulphate, nickel (II) sulphate, dissolved in any of the above acids.

Additionally, a mixture of different metal activators may be used in a single process.

Using an inert electrode such as platinum, platinized titanium, platinum on niobium or tantalum, ruthenium or iridium dioxide on titanium, or carbon (glassy or vitreous) and a current density of 1 mA/cm$^2$ to 10 A/cm$^2$ with 500 mA/cm$^2$ being preferred for ABS, the oxidized metal activator species (e.g. $Ag^{2+}$ or $Co^{3+}$) form rapidly and can readily attack polymers such as ABS giving a nicely textured surface virtually identical to that produced with chromic acid. Subsequent processing with a reducing agent and electroless metal plating solution e.g., copper plating gives electroless copper deposits with adhesion values equal to or better than those from substrates metallized following conventional chromic acid treatment. Oxidized cobalt species can be generated without a divided electrochemical cell, providing further cost reductions and easier processing.

The oxidized metal activator species can be generated by methods other than electrochemical reaction. For example, silver$^{2+}$ ions can be generated chemically from solutions of silver$^{+1}$ ions by oxidation with strong oxidizing agents such as ozone or by dissolution of silver (II) oxide, silver (II) fluoride or silver (II) fluorosulphate in acid. Other oxidized metal activators also can be generated chemically, rather than electrochemically. However, for ease of processing, electrochemical regeneration is generally preferred.

Regardless of how the oxidized metal activator species or ions are generated, it is desirable to use the oxidized species in the form of an aqueous solution where the oxidized species are present in a concentration of from 0.01 moles to 2.0 moles and preferably, in a concentration of from 0.1 to 1 mole per liter of treatment solution. The actual preferred concentration is dependent upon the substrate to be treated, which concentration can be readily determined empirically based on the present disclosure. The higher concentrations are generally more active. ABS is readily etched and a lower concentration solution of the metal activator ions in solution would be used to treat ABS than, for example, epoxy where a higher concentration of the oxidized activator in solution would be required.

As discussed above, if the part to be plated, e.g. a polymer part such as an ABS part, is treated with the metal activator and subsequently immersed in a solution of a reducing agent such as a phosphite such as sodium hypophosphite; or a thionite such as sodium dithionite; or formaldehyde; or a hydride such as sodium borohydride; or a borane such as dimethylaminoborane (DMAB), the reduced metal activator (e.g. silver, cobalt, etc.) remains and the ABS or other part can be immediately plated with electroless metal e.g., copper without any further conditioning or catalyzation steps. The reducing solution contains sufficient reducing agent to reduce at least a portion of the oxidized metal activator. For this reason, the concentration of the reducing agent is dependent upon its ability to reduce the oxidized metal activator. Strong reducing agents may be used in lower concentration. Typically, the reducing agent is present in a molar ratio of from 0.1 to 2.5 times the concentration of the metal activator and preferably, in a ratio of from 0.2 to 1.2 times the concentration of the metal activator.

It is an important aspect of the invention that the oxidized metal activator, such as $Ag^{2+}$, $Co^{3+}$, cerium (IV), iron (III), manganese (IV), nickel (III), ruthenium (V), rhodium (IV), metavanadate, etc. species, may be continuously regenerated. Therefore, the total loss of metal couple is small offsetting the cost of the relatively expensive metal couple salts. By continuous regeneration, though some metal loss will occur due to dray-out and uncharacterized side reactions, the overall loss is minimal. Regeneration may be easily conducted, e.g. by subjecting the solution after exposure to a part to be plated to further electrochemical treatment to regenerate higher oxidation state metal species. Even more preferably, regeneration is continually conducted during exposure of parts to provide a more or less steady state of oxidized metal activator species.

As a preferred embodiment of this invention oxidized metal activator species, which may be e.g. electrochemically generated $Ag^{2+}$, $Co^{2+}$ or $Co^{3+}$ ions or species are employed in a combined surface treatment and metallization process where the oxidized metal activator species ions generate reactive hydroxyl species (e.g. hydroxyl radicals) capable of texturizing the polymer surface and which can also be reduced to a lower oxidation state metal activator (e.g. silver metal or cobalt metal) on the surface so that the reduced metal catalyzes the subsequent electroless metal to be deposited thereon from a bath thereof e.g., copper, nickel, etc.

Silver ions normally exist in solution as the single charged $Ag^+$ ion, as is typically found for example in solutions of silver (I) nitrate, silver (I) tefrafluoroborate, silver (I) perchlorate and silver (I) fluoride. However, under certain conditions silver can be oxidized further to the doubly charged $Ag^{2+}$ ion or species. This ion is very reactive and can be used to attack virtually all organic materials including polymers. The $Ag^{2+}$ ion in solution is not stable and through a series of reactions converts back to $Ag^+$, typically over a period of a few days. However, the reversion of $Ag^{2+}$ to $Ag^+$ leads to the generation of hydroxyl radicals and it is this species that is so aggressive towards organic chemical bonds.

The major reaction steps resulting in the surface treatment are not fully understood but are generally described by the following mechanism where PolyH and Poly OH represent the untreated and treated polymer surfaces, respectively.

At the anode $2Ag^+ \rightarrow 2Ag^{2+}+2e^-$

At the polymer surface $2Ag^{2+}+PolyH+3H_2O \rightarrow 2Ag^++Poly\ OH+2H_3O^+$ At the cathode $2H_3O^++2e^- \rightarrow H_2+2H_2O$ Overall $PolyH+H_2O \rightarrow Poly\ OH+H_2$ The room temperature process requires only the consumption of electricity and water, and the only by-product is hydrogen. The latter point represents a significant improvement over the other "wet" treatments which require the disposal of toxic materials. Furthermore, any organic or biological matter present is oxidized to produce carbon dioxide and water. The mechanism outlined above clearly should not be considered as being definitive: in particular, it is quite likely that further oxidation takes place, possibly involving the formation of carbonyl surface groups.

The temperature of various solutions used in the processes of the invention may suitably vary through a wide range. Some preferred temperatures are set forth in the examples which follow. For instance, a plastic such as an ABS or epoxy substrate, may be first treated with a conditioner solution that is above room temperature, e.g. from about 30 to 50° C., more preferably about 35 to 45° C. The part then may be treated with the oxidized metal activator solution that also is preferably above room temperature, e.g. from about 30 to 80° C., more preferably about 40 to 50 or 60° C. The part is then exposed to a reducing agent, which again preferably is at a temperature above room temperature, e.g. from about 25 to 50° C., more preferably about 28 to 35° C. Electroless plating may be conducted at electaed temperatures at is known, e.g. from about 40 to 50° C.

Parts may be exposed to such treatment solutions by immersion, although spray applications also could be employed, at least for some treatments.

The copper deposits formed using processes of the invention have excellent appearance and adhesion. The processes of the invention can replace several steps in the conventional chromic acid based process and in particular it removes the need for an expensive tin/palladium catalyst stage. Although without desiring to be bound to the theory as to what is occurring as a result of using the reducing agent, it is believed that the reducing agent acts to reduce residual metal activator (e.g. silver ions) on the polymer substrate to ground state metal (e.g. silver metal) which is then able to catalyze the electroless copper reaction.

After application of the electroless copper to the polymer substrate, the copper may then be electroplated using conventional technology if desired. It has also been found as another aspect of the invention that applying a solvent swelling system on the substrate prior to etching as taught herein improves the adhesion of the metal to the polymer substrate. For example, solvents such as propylene carbonate, butyrolactone or combinations thereof or methyl ethyl ketone are representative of solvent swelling agents which soften and then swell the polymer surface. A Shipley conditioner product known as PM-920 is useful for this purpose. Also see U.S. Pat. No. 5,178,956 regarding conditioners used prior to etching using etchants other than those described herein.

Commercially available electroless plating compositions can be employed in the processes of the invention. For example, the Shipley Company (Marlborough, Mass., USA) has suitable solutions. Shipley's C3000 Electroless Copper is a preferred plating solution. Suitable electroless plating solutions and the use thereof also are widely described in the literature. See, for example, *Coombs, Printed Circuits Handbook*, (3$^{rd}$ Edition, McGraw Hill), which is incorporated herein in its entirety. See also U.S. Pat. No. 4,515,829 to Deckert et al., incorporated herein by reference. See also Shipley's U.S. Pat. Nos. 4,539,044; 3,765,936; and 3,661,597, all incorporated herein by reference.

Silver$^{2+}$ (II) was used to treat waste matter (See EP 2 977 738 and U.S. Pat. Nos. 4,874,485 and 4,925,643). Also see the paper (3 pages) provided at Science Open Meeting in London, U.K on May 7, 1997 entitled "New Pretreatments for Polymers", D. M. Brewis, R. H. Dahm and I. Matheson, for the use of silver II and the generation thereof and the one page paper provided at the 1996 Swiss Bonding Meeting entitled, "A New General Method for the Pretreatment of Polymers".

Referring now to the Drawings, FIG. 1 diagrammatically illustrates the etching of the plastic substrate. In FIG. 1, there is shown a container 10 which is divided by a cation exchange membrane 11, e.g., DUPONT NAFION-fluoro polymer cation exchange membrane. At 12, there is shown a platinised-titanium mesh electrode (cathode) coupled to the negative terminal of a direct current (d.c.) source. An anode 13 of platinised-titanium mesh electrode is connected to the positive terminal +Ve of the d.c. source.

Between the membrane and the anode 13 there is positioned the plastic substrate, e.g., ABS in the shape of a plaque which is to be etched and which is attached to a holder 14A for moving it into and out of the liquid bath 15.

Agitation is provided by a magnetic stirrer (not shown).

Figure 2:
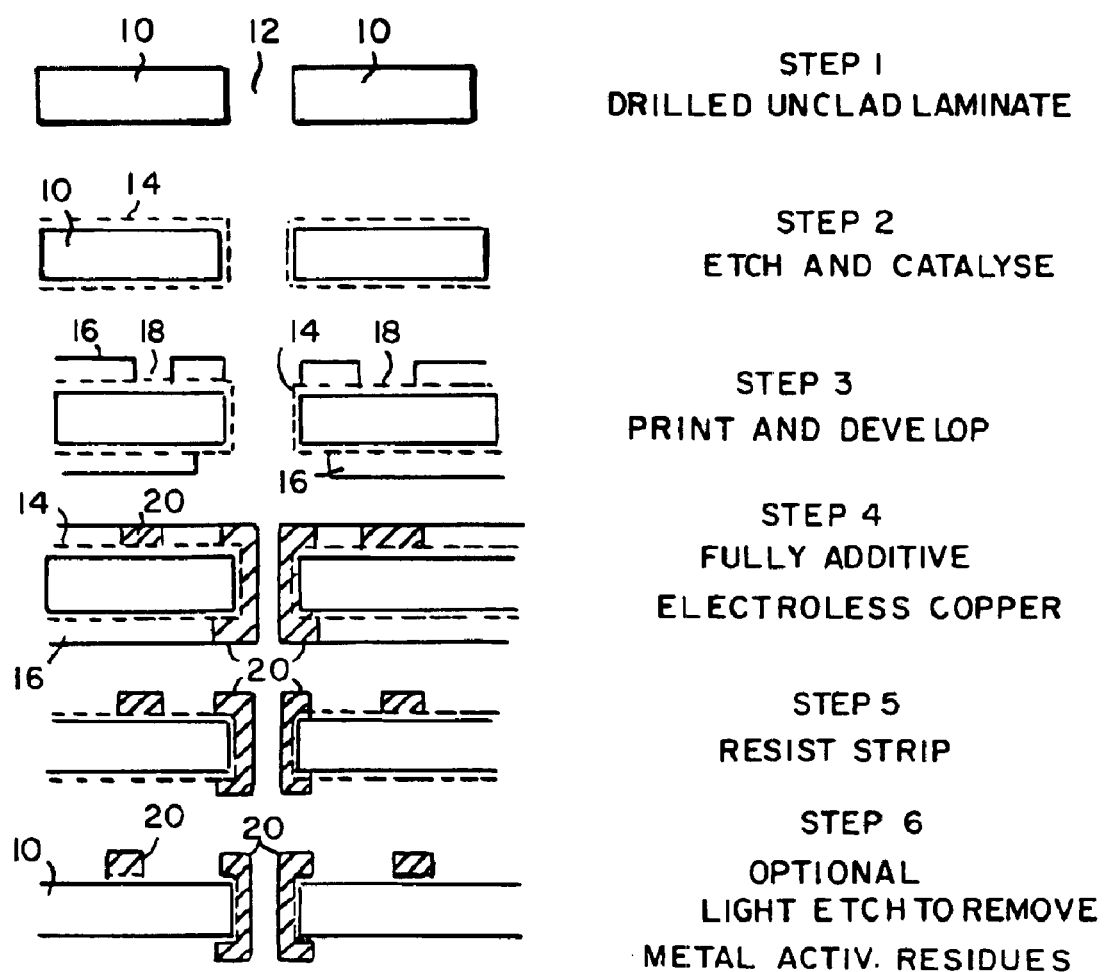
FIG. 2 shows a preferred additive process of the invention.

FIG. 2 diagrammatically illustrates a preferred additive process of the invention to plate a printed circuit board, including the through holes. In Step 1 of that process, a printed circuit board substrate 10 having through holes 12 is provided. That substrate 10 may be a laminate material formed from ABS, polyamide, polycarbonate, polyetherimides, expoxies, etc., and blends thereof. In Step 2, the surface of substrate 10 is exposed to an oxidized metal activator, e.g., oxidized silver, cobalt or the like wherein the oxidized species may have been suitably generated electrochemically, as described above with respect to FIG. 1. In that Step 2, the substrate 10 is then exposed to a reducing agent, e.g. a borane, preferably to leave a metal 14 (e.g. Ag if oxidized Ag used as the metal activator) on the substrate. In Step 3, a photoresist 16 then is applied to the planar surfaces and exposed and developed to provide desired bared substrate areas 18. The photoresist may be a dry film or applied as a liquid resist In Step 4, the treated substrate 10 is immersed or other treated in an electroless plating solution to provide additive electroless metal layers 20, which typically will be electroless copper layer. In Step 5, photoresist 16 is stripped using suitable materials, e.g. a commercial resist stripper solution, which often will be an alkali solution. In Step 6, an etch may be employed if desired to remove any reduced metal activator 14 on the non-plated surfaces of substrate 10.

FIG. 3 diagrammatically illustrates a preferred pattern plate process of the invention to plate a printed circuit board, including through holes thereof. Steps 1 and 2 are the same as described above with respect to FIG. 2. Thus, in Step 1 of the process of FIG. 3, a printed circuit board substrate 40 having through holes 42 is provided. That substrate 40 again may be a laminate material formed from ABS, polyamide, polycarbonate, polyetherimides, epoxy resin, etc., and blends thereof. In Step 2, the surface of substrate 40 is exposed to an oxidized metal activator, e.g., oxidized silver, cobalt or the like wherein the oxidized species may have been suitably generated electrochemically, as described above with respect to FIG. 1. In that Step 2, the substrate 40 is then exposed to a reducing agent, e.g. a borane, preferably to leave a metal 44 (e.g. Ag if oxidized Ag used as the metal activator) on the substrate. In Step 3, the treated substrate 40 is immersed or other treated in an electroless plating solution to provide an electroless metal layer 46, which typically will be an electroless copper layer. In Step 4, a photoresist 48 then is applied to the planar substrate surfaces and exposed and developed to provide desired bared electrolessly plated substrate areas 50. The photoresist may be a dry film or applied as a liquid resist. In Step 5, the treated substrate 10 is electroplated, e.g. with copper or other metal to provide electrolytic metal layers 52. In Step 6, photoresist 48 is stripped using suitable materials, e.g. a commercial resist stripper solution, which may be an alkali solution. In Step 7, an etch may be employed to remove exposed electroless layer 46.

The following non-limiting examples are illustrative of the invention. The preferred process for metallizing plastics such as ABS, expoxy laminates and the like include the following steps showing ingredient, amounts, temperature conditions and time (expressed as minutes or MINS).

EXAMPLE 1

Metallization of ABS

| PROCESS STEPS | MAKE-UP | TEMP/° C. | TIME-MINS |
|---|---|---|---|
| 1. Apply PM 920 Conditioner[1] to ABS substrate | 180–250 ml/l | 38 | 1 |
| Rinse (cold water) | | | 2 |
| 2. $Ag^{2+}$ Etch | 4M/l $HNO_3$ + 1 M/l $AgNO_3$ i=0.5 A/cm$^2$ | 50 | 14 |
| Rinse (cold water) | | | 2 |
| 3. Apply reducing agent Sodium borohydride | 5 g/l | 30 | 1 |
| Rinse (cold water) | | | 2 |
| 4. Plate with Cuposit 251 Electroless Copper[1] | | 46 | 15 |
| Rinse (cold water) | | Room Temperature | 90 |
| 5. Apply 10% $H_2SO_4$ dip | | Room Temperature | 2 |
| 6. Electroplate with Electroposit 1200 Copper[1] | | Room Temperature | 90 |
| Rinse (cold water) | | Room Temperature | |
| 7. Bake | | 70 | 60 |

[1]Available from Shipley Company, L.L.C. of Marlboro, Massachusetts, United States of America

EXAMPLE 2

Metallization of ABS

| PROCESS STEPS | TEMP/° C. | TIME/MINS |
|---|---|---|
| 1. Apply PM920 Conditioner to ABS substrate | 38 | 1 |
| Rinse (Cold Water) | | 2 |
| 2. $Ag^{2+}$ Etch (having a make-up the same as the Ag2+ etch of Example 1 above) | 50 | 14 |
| Rinse (Cold Water) | | 2 |
| 3. Apply 10 g/l Sodium Hypophosphite + 35 ml/l sodium hydroxide i=0.5 A/cm$^2$ | 25 | 1 |
| Rinse (Cold Water) | | 2 |
| 4. Plate with Cuposit 251 Electroless Copper | 46 | 15 |
| Rinse (Cold Water) | | 2 |
| 5. Apply 10% $H_2SO_4$ dip | Room Temperature | 1 |
| 6. Electroplate with Electroposit 1200 Copper | Room Temperature | 90 |
| Rinse (Cold Water) | | 2 |
| 7. Bake | 70 | 60 |

EXAMPLE 3

Metallization of FR4 Epoxy Circuit Board Substrate

| PROCESS STEPS | MAKE UP | TEMP/° C. | TIME-MINS |
|---|---|---|---|
| 1. Apply Circuposit Hole prep 4125 (Shipley) to FR4 epoxy | 200 ml/l | 75 | 20 |
| Rinse (cold water) | | | 2 |
| 2. $Ag^{2+}$ Etch | 4M/l $HNO_3$ + 0.5M/l $AgNO_3$ i=0.39 A/cm$^2$ | 25 or 50 | 30 or 15 |
| Rinse (cold water) | | | 2 |
| 3. Apply reducing agent Sodium borohydride | 20 g/l | 25 | 1 |
| Rinse (cold water) | | | 2 |
| 4. Plate with Cuposit 251 Electroless Copper[1] | | 46 | 15 |
| Rinse (cold water) | | | 90 |

[1]Available from Shipley Company, L.L.C. of Marlboro, Massachusetts, United States of America

EXAMPLE 4

Metallization of Photoimageable Dielectric

| PROCESS STEPS | MAKE UP | TEMP/° C. | TIME-MINS |
|---|---|---|---|
| 1. Apply Circuposit Hole prep 4125 to CIBA eboxy-based dielectric layer | 200 ml/l | 75 | 20 |
| Rinse (cold water) | | | 2 |
| 2. Ag+ Etch | 4M/l $HBF_4$ + 1 M/l $AgBF_4$ i=0.5 A/cm² | 50 | 20 |
| Rinse (cold water) | | | 2 |
| 3. Apply reducing agent Sodium Hypophosphite + 35 ml/l Cuposit Z (Shipley) | 20 g/l | 25 | 1 |
| Rinse (cold water) | | | 2 |
| 4. Plate with Cuposit 251 Electroless Copper[1] | | 46 | 15 |
| Rinse (cold water) | | | 2 |
| 5. Apply 10% $H_2SO_4$ dip | | RT | 1 |
| 6. Electroplate with Electroposit 1200 Copper (Shipley) | | RT | 90 |
| Rinse (cold water) | | | 2 |
| 7. Bake | | 120 | 60 |

[1]Available from Shipley Company, L.L.C. of Marlboro, Massachusetts, United States of America

EXAMPLE 5

Metallization of ABS

| Process Step | Make-up | Temperature (° C.) | Time (mins) |
|---|---|---|---|
| PM920 conditioner[1] | | 38 | 1 |
| 1. Cold water rinse of ABS substrate | | | 2 |
| 2. Apply 3302 conditioner[1] to part | | 60 | 5 |
| 3. Cobalt etch | 0.1 M $CoSO_4$/2.4 M $H_3PO_4$ | 35 | 30 |
| 4. Cold water rinse | | | 2 |
| 5. Reducing agent | DMAB 80 g/l | 25 | 15 |
| 6. Cold water rinse | | | 2 |
| 7. Copper bath | Shipley Circuposit 3361[1] | 52 | 30 |
| 8. Cold water rinse | | | 2 |

[1]Available from Shipley Company, L.L.C. of Marlboro, Massachusetts, United States of America It should be clear that the above process amounts, times, ingredients and etc. may be modified without departing from the invention.

It should also be understood that this process is applicable to polymers other than ABS with exception that in case of using silver as the metal activator, polymers having carbon-fluorine bonds are preferred. The processes of the invention are useful for metallization of a wide variety of organic resin, including e.g. metallization of polyetherimides for use in metallization of molded electrical interconnect devices. The process also has application in the metallization of polymers for electromagnetic energy shielding.

The foregoing description of the invention is merely illustrative thereof, and it is understood the variations and modifications can be effected without departing from the spirit or scope of the invention as set forth in the following claims.

What is claimed is:

1. A process for metal deposition comprising:

(a) providing an aqueous solution comprising one or more metal activator species;

(b) contacting a part to be plated with the solution comprising one or more metal activator species, wherein the one or more metal activator species are oxidized to generate hydroxyl species;

(c) etching the part with reactive hydroxyl species generated from water as a result of presence of the metal activator species in the aqueous solution;

(d) contacting the part with a solution of reducing agent capable of reducing the metal activator species; and (e) metal plating the part by contact with an electroless plating solution;

wherein the metal activator species is one or more agents chosen from silver (II), cobalt (III), ruthenium (V), (VI), (VII), (VIII), cerium (III) or (IV), iron (I)) or (III), manganese (IV or higher), rhodium (IV) or vanadium (IV) or (V).

2. The process of claim 1 wherein the part is immersed in an aqueous solution comprising one or more metal activator species.

3. The process of claim 1 wherein the metal activator is oxidized electrochemically.

4. The process of claim 1 wherein the metal activator is selected from cobalt (III), ruthenium (V), (VI), (VII), (VIII), cerium (III) or (IV), iron (I)) or (III), manganese (IV or higher), rhodium (IV) or vanadium (IV) or (V).

5. The process of claim 1 wherein the metal activator is silver.

6. The process of claim 1 wherein the metal activator is cobalt.

7. The process of claim 1 wherein the part comprises an organic plastic.

8. The process of claim 1 wherein the part comprises acrylonitrile butadiene styrene, polyamide, epoxy, polycarbonate, or polyetherimide, or blends thereof.

* * * * *